(12) United States Patent
Roehr

(10) Patent No.: US 7,289,350 B2
(45) Date of Patent: Oct. 30, 2007

(54) ELECTRONIC DEVICE WITH A MEMORY CELL

(75) Inventor: Thomas Roehr, Aschheim (DE)

(73) Assignee: Infineon Technologies AG, Munich (DE)

(*) Notice: Subject to any disclaimer, the term of this patent is extended or adjusted under 35 U.S.C. 154(b) by 8 days.

(21) Appl. No.: 11/099,384

(22) Filed: Apr. 5, 2005

(65) Prior Publication Data

US 2006/0221663 A1    Oct. 5, 2006

(51) Int. Cl.
*G11C 11/00* (2006.01)
(52) U.S. Cl. .................... 365/148; 365/163; 365/178
(58) Field of Classification Search ............... 365/148, 365/53, 163, 158, 72
See application file for complete search history.

(56) References Cited

U.S. PATENT DOCUMENTS

| 5,363,327 A |   | 11/1994 | Henkles et al. |        |
|-------------|---|---------|----------------|--------|
| 6,606,263 B1| * | 8/2003  | Tang ........... | 365/158|
| 6,807,090 B2| * | 10/2004 | Johnson ......  | 365/170|
| 6,937,497 B1| * | 8/2005  | Ju et al. ..... | 365/130|

(Continued)

FOREIGN PATENT DOCUMENTS

EP        0 607 547 A1    7/1994

OTHER PUBLICATIONS

M.N. Kozicki, M. Yun, L. Hilt, and A. Singh, *Application Of Programmable Resistance Changes In Metal-Doped Chalcogenides*, Electromechanical Society Proc., vol. 99-13, pp. 298-309 (1999).

(Continued)

*Primary Examiner*—Amir Zarabian
*Assistant Examiner*—Michael Weinberg
(74) *Attorney, Agent, or Firm*—Patterson & Sheridan, L.L.P.

(57) ABSTRACT

The present invention relates to an electronic device comprising a memory cell with a resistive storage element having a first terminal and a second terminal. The resistive storage element can be switched between a first storage state with a first conductivity and a second storage state with a second conductivity. An access switch is coupled to the first terminal of the resistive storage element and to a node for connecting the first terminal of the resistive storage element to the node in an access state of the memory cell and for insulating the first terminal of the resistive storage element from the node in an idle state of the memory cell. A protecting switch is connected to the resistive storage element. The protecting switch, in the idle state of the memory cell, reduces the voltage across the resistive storage element produced by electromagnetic interference and, in the access state of the memory cell, enables the reading and the writing of the storage states of the resistive storage element. The electronic device may further comprise a control circuit operatively coupled to the access switch and to the protective switch which is configured to control the function of the access switch and the protecting switch in the access state and in the idle state of the memory cell.

23 Claims, 2 Drawing Sheets

U.S. PATENT DOCUMENTS

| | | | |
|---|---|---|---|
| 6,972,427 B2 * | 12/2005 | Roehr et al. ................... | 257/2 |
| 7,016,222 B2 * | 3/2006 | Morikawa ................... | 365/158 |
| 7,023,009 B2 * | 4/2006 | Kostylev et al. ............... | 257/4 |
| 7,145,790 B2 * | 12/2006 | Kang .......................... | 365/148 |
| 2004/0124407 A1 * | 7/2004 | Kozicki et al. ................ | 257/9 |
| 2004/0160809 A1 * | 8/2004 | Lin et al. .................... | 365/158 |
| 2006/0050545 A1 * | 3/2006 | Rohr .......................... | 365/148 |
| 2006/0050546 A1 * | 3/2006 | Roehr ........................ | 365/148 |
| 2006/0062043 A1 * | 3/2006 | Roehr et al. ................ | 365/149 |
| 2006/0067147 A1 * | 3/2006 | Roehr ........................ | 365/207 |

OTHER PUBLICATIONS

S. Kaeriyama et al., "A Nonvolatile Programmable Solid Electrolyte Nanometer Switch", IEEE Journal of Solid-State Circuits, vol. 40, No. 1, pp. 168-176, Jan. 2005.

Faccio Federico, Cern, "ESD protection of circuits designed using the CERN library in CMOS6SF", Jul. 31, 2001, http://deepsub.web.cern.ch/deepsub/dosc/ESD.pdf.

German Patent Office Examination Report dated Mar. 17, 2006.

* cited by examiner

ELECTRONIC DEVICE WITH A MEMORY CELL

BACKGROUND OF THE INVENTION

1. Field of the Invention

The present invention relates to an electronic device having a memory cell comprising a resistive storage element which can be switched between a first storage state having a first conductivity and a second storage state having a second conductivity.

2. Description of the Related Art

In contrast to static random access memories (SRAM) and dynamic random access memories (DRAM), non-volatile memory devices preserve the stored information even if they are not supplied by electrical energy. They combine the advantages of random access memories (no mechanics and almost instant access to any bit of information) with advantages of hard disk drives and other permanent storage media (long-term storage without power consumption). Thus, non-volatile random access memory devices are advantageous for many applications, and high effort is made in their development and improvement.

A number of non-volatile random access memory technologies exist, each of which provides specific advantages and disadvantages. Several particularly advantageous and promising technologies use resistive storage elements. Each storage element can be switched between a first storage state having a first conductivity and a second storage state having a second conductivity. Each of the storage states represents a "0" or a "1". Information is written to the storage element by means of a localized magnetic field (MRAM; based on the magneto-resistive effect), by a thermally induced or supported phase change (PCRAM; based on materials existing in two different crystallographic phases with differing resistances) or by a generation or degradation of conductive bridges in an otherwise insulating material (CBRAM; based on an induced migration of ions into a material or a remigration out of the material).

In an idle state of the memory cell, the cell transistor coupled between the resistive storage element and a bit line is in a highly resistive OFF-state. If the conductivity of the resistive storage element is very low in one of the storage states, in this storage state and the idle state of the memory cell, the memory cell comprises a floating node between the resistive storage element and the transistor. The potential of this floating node is easily influenced by electromagnetic fields and particularly by potentials of adjacent conductors. The influenced potential may induce an unintentional change of the storage state of the resistive storage element, thereby corrupting the information stored in the resistive storage element.

SUMMARY OF THE INVENTION

The present invention relates to an electronic device with a memory cell and a control circuit. The memory cell comprises a resistive storage element having a first terminal and a second terminal. The resistive storage element is switchable between a first storage state having a first conductivity and a second storage state having a second conductivity. The memory cell also comprises an access switch which is coupled to the first terminal of the resistive storage element and a node. The access switch connects the first terminal of the resistive storage element to the node in an access state of the memory cell and insulates the first terminal of the resistive storage element from the node in an idle state of the memory cell. The memory cell furthermore comprises a protecting switch which is connected to the resistive storage element. The protecting switch, in the idle state of the memory cell, reduces the voltage across the resistive storage element produced by electromagnetic interference and, in the access state of the memory cell, enables the reading and the writing of the storage states of the resistive storage element. The control circuit is operatively coupled to the access switch and the protecting switch and is suitable to control the function of the access switch and the protecting switch in the access state and in the idle state of the memory cell.

Furthermore, the present invention relates to an electronic device with a memory cell. The memory cell comprises a resistive storage element having a first terminal and a second terminal. The resistive storage element is switchable between a first storage state having a first conductivity and a second storage state having a second conductivity. A first electronic switch is coupled to the first terminal of the resistive storage element and a data line for connecting the first terminal to the data line in an access state of the memory cell, and for insulating the first terminal from the data line in an idle state of the memory cell. A second electronic switch is coupled to the second terminal of the resistive storage element and a reference potential line, for connecting the second terminal to the reference potential line in the access state and for insulating the second terminal from the reference potential line in the idle state.

Furthermore, the present invention relates to an electronic device with a memory cell and a control circuit. The memory cell comprises a resistive storage element having a first terminal and a second terminal. The resistive storage element is switchable between a first storage state having a first conductivity and a second storage state having a second conductivity. A first electronic switch is coupled to the first terminal of the resistive storage element and a data line. A second electronic switch is coupled to the first terminal of the resistive storage element and a reference potential line. The control circuit is operatively coupled to the first and the second electronic switches and is suitable for controlling the first and the second electronic switches in such a way that the second electronic switch connects the first terminal to the reference potential line when the first electronic switch does not connect the first terminal to the data line, and such that the second electronic switch does not connect the first terminal to the reference potential line when the first electronic switch connects the first terminal to the data line.

Furthermore, the present invention relates to an electronic device with a memory cell and a control circuit. The memory cell comprises a resistive storage element having a first terminal and a second terminal. The resistive storage element may be switched between a first storage state having a first conductivity and a second storage state having a second conductivity. A first electronic switch is coupled to the first terminal of the resistive storage element and a data line. A second electronic switch is coupled to the first and second terminals of the resistive storage element. The control circuit is operatively coupled to the first and the second electronic switches and is suitable for controlling the first and the second electronic switches such that the second electronic switch connects the first terminal to the second terminal when the first electronic switch does not connect the first terminal to the data line, and such that the second electronic switch does not connect the first terminal to the second terminal when the first electronic switch connects the first terminal to the data line.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Overview

Figure 1:
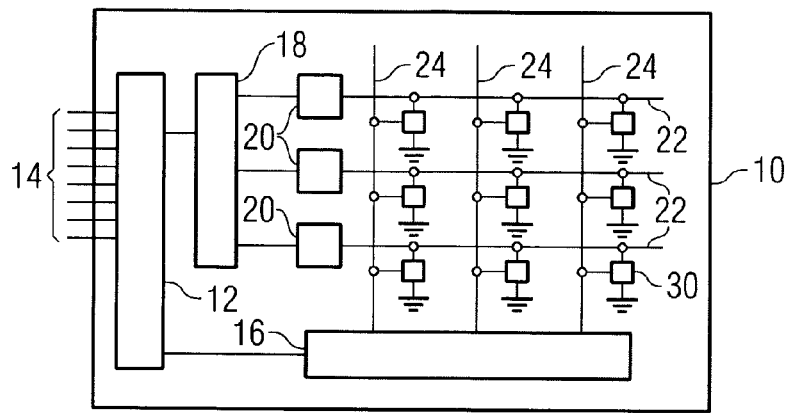
FIG. 1 is a schematic circuit diagram of an electronic device according to an embodiment of the present invention.

One aspect of the present invention provides an electronic device having a memory cell comprising a resistive storage element, the memory cell and the electronic device providing a reduced risk of corruption of the information stored therein by electromagnetic interference. The electronic device may be, for example, a non-volatile memory device with a large number of resistive storage elements each storing one bit of information whereby each of the storage states is identified with one of the bit states "0" and "1".

Each memory cell may be provided with a transistor or another kind of switch, which serves as a protective switch. This protective switch, in an idle state of the memory cell when no data is written to or read from the memory cell, either short-circuits the resistive storage element or insulates the second terminal not coupled to the conventional cell transistor from ground or any other reference potential line. In both cases, any electromagnetic interference from outside the memory cell generally does not induce a voltage across the resistive storage element, or at least the induced voltage is considerably reduced by the protective switch.

In the first case, in the idle state of the memory cell, the protective switch is in its low resistive ON-state and short-circuits the two terminals of the resistive storage element. Thereby, the electrostatic potentials of the terminals of the resistive storage elements are pinned to each other and no voltage can be induced across the resistive storage element. Alternatively, the protective switch is coupled to the first terminal which is coupled to an access switch as well and to a reference potential line wherein the second terminal of the resistive storage element is coupled to the same reference potential line or to another reference potential line with a predetermined potential difference.

In the second case, in the idle state, the protective switch is in its highly resistive OFF-state insulating the second terminal from a reference potential line, whereby the first terminal of the resistive storage element is insulated from a data line by an access switch in its OFF-state. The access switch and the protective switch may provide about the same high resistance in their OFF-states. Both terminals of the resistive storage element float, and both terminals are influenced by electromagnetic interference to nearly the same extent. Thus, only relatively small voltages across the resistive storage element can be induced by electromagnetic interference. The smaller the difference between the resistances of the access switch and the protective switch in their OFF-states is, the smaller are the voltages induced across the resistive storage element.

The present invention provides protection against the corruption of stored information. Since electronic switches and, in particular, field effect transistors and bipolar transistors can be miniaturized to a high extent, the chip space required for each single memory cell is enlarged merely to a small extent.

Furthermore, the electronic device according to embodiments of the invention can be easily produced with conventional semiconductor technologies and low production costs.

Furthermore, the protective switch can be easily designed in such a way that it protects the resistive storage element from voltages induced electromagnetically even if the electronic device is not supplied with electrical power. For this purpose, the protective switch is a normally-ON-switch (in the first of the above-described two cases) or a normally-OFF-switch (in the second of the above-described two cases), respectively.

Aspects of the present invention may be applied to resistive storage elements with two or any higher number of resistance states or storage states.

DETAILED DESCRIPTION

FIG. 1 is a schematic circuit diagram of an electronic device 10 according to an embodiment of the present invention. In this embodiment, the electronic device 10 is a memory device with an input/output section 12 comprising receiving and transmitting circuits for communication with other devices, e.g., a processor of a computer, via control, address and data lines 14. Furthermore, the memory device 10 comprises a row address decoder 16 and a column address decoder 18 operatively connected to the input/output section 12. A number of read and write circuits 20 is operatively connected to the column address decoder 18. A number of bit lines 22 are arranged generally in parallel to each other. Each of the bit lines 22 is connected to one of the read and write circuits 20. A number of word lines 24 are arranged generally in parallel to each other and perpendicular to the bit lines 22. The word lines 24 are coupled to the row address decoder 16. At each intersection of a bit line 22 and a word line 24, a memory cell 30 is arranged. The memory cells 30 may be arranged generally as a rectangular array. Each memory cell 30 is connected to the adjacent bit line 22 and the adjacent word line 24.

The memory device 10 is connected to other devices or external circuits via the control, address and data lines 14. The input/output section 12 receives control, address and data signals. The control signals in particular comprise read and write commands for the memory device 10. The address signals indicate addresses identifying one or more memory cells from which data is to be read or into which data is to be written, respectively. The data signals represent the data which are to be written into the memory cells identified by the address signals.

Furthermore, the memory device 10 transmits data signals to other devices or external circuits via the input/output section 12 and the control, address and data lines 14. These data signals represent the data read from memory cells 30.

In accordance with an address received by the input/output section 12, the row address decoder 16 selects and activates one of the word lines 24 which is identified by the address and the column address decoder 18 selects one or more of the read and write circuits 20 which are identified by the address. Each selected read and write circuit 20 then reads data from or writes data to the memory cell 30, coupled to the activated word line 24 and connected to the selected read and write circuit 20 via one of the bit lines 22. In one embodiment, the components of input/output section 12, control, address and data lines 14, row address decoder 16, column address decoder 18, read and write circuit 20, bit line 22, and word line 24 make up the control circuit of the electronic device 10. The structure and the read and write operation of the memory cells 30 are described below with respect to FIGS. 2 to 6.

Although the electronic device 10 is described above and displayed in FIG. 1 as a memory device, it is to be noted that the present invention refers to all kinds of electronic devices with memory cells. The application of the present invention to memory devices is particularly advantageous as it will become clear from the description below, and the structure and architecture may considerably differ from FIG. 1. However, the present invention is also applicable and advantageous for other kinds of electronic devices with memory cells. For example, the electronic device may additionally comprise processing circuits, memory cells other than that described below and other electronic, microelectronic or micromechanical features.

According to one embodiment of the present invention, the memory cells 30 comprise a resistive storage element 40. The structure of each embodiment of the memory cell 30 is described below with respect to FIGS. 2 to 4. In the following description for the embodiments shown in FIGS. 2 to 4, the same component may be referenced individually or collectively with the same reference numeral while variations of the same component are designated with subscripts reflecting individual embodiments.

Figure 2:
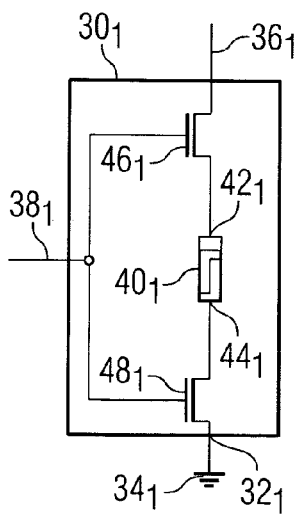
FIG. 2 is a schematic circuit diagram of a first embodiment of a memory cell of the electronic device of FIG. 1.

FIG. 2 is a schematic circuit diagram of a memory cell $30_1$ according to one embodiment of the present invention. A first terminal 32, of the memory cell $30_1$ is coupled to ground $34_1$ or to a line providing any other constant reference potential. A second terminal $36_1$ of the memory cell $30_1$ is coupled to a data line. A third terminal $38_1$ of the memory cell $30_1$ is coupled to a control line. In the embodiment described above with respect to FIG. 1, the data line connected to the second terminal $36_1$ is one of the bit lines 22, and the control line connected to the third terminal $38_1$ is one of the word lines 24.

Furthermore, the memory cell $30_1$ comprises a resistive storage element $40_1$. The resistive storage element $40_1$ may be switched between a first storage state having a first conductivity and a second storage state having a second conductivity. The difference between the first and the second conductivities may be a few multiples of ten percent up to several orders of magnitude. Both the first and second storage states are persistent over a long period of time (e.g., of at least several seconds, a few minutes, hours, days or even years). In one embodiment, each of the first and second storage states is indefinitely persistent at least under normal operating conditions (temperature, electromagnetic fields, etc.).

An important characteristic for the resistive storage element is an element showing hysteresis with respect to its resistance or conductivity, respectively, whereby each of the first and the second storage states is one of the saturation states of the hysteresis. One example for a resistive storage element 40 will be described below in more detail with respect to FIGS. 5 and 6.

The resistive storage element $40_1$ has a first terminal $42_1$ and a second terminal $44_1$. A first switch or an access switch $46_1$ is coupled to the first terminal $42_1$ of the resistive storage element $40_1$. A second switch or a protective switch $48_1$ is coupled to the second terminal $44_1$ of the resistive storage element $40_1$. The first switch $46_1$, the resistive storage element $40_1$ and the second switch $48_1$ are connected respectively in series between the second and the first terminals $36_1$, $32_1$ of the memory cell $30_1$. The first and second switches $46_1$, $48_1$ are operatively coupled to the third terminal $38_1$ of the memory cell $30_1$ such that the first and the second switches $46_1$, $48_1$ can be controlled via the third terminal $38_1$ of the memory cell $30_1$.

In FIG. 2 as well as in the subsequently discussed FIGS. 3 and 4, the first and second switches 46, 48 are represented as field effect transistors (FET). FETs are frequently used in microelectronic devices and particularly in memory cells as they can be miniaturized to an extremely high extent. However, bipolar transistors and other electronic switches may be used as the first and the second switches 46, 48 in all the embodiments described with respect to FIGS. 2 to 4 as well.

Referring back to FIG. 2, in an idle state of the memory cell $30_1$, when no information is read from or written to the memory cell $30_1$, the first and the second switches $46_1$, $48_1$ are in their OFF-states with a high resistance. Any voltage between the second terminal $36_1$ and the first terminal $32_1$ does not affect the resistive storage element $40_1$ and is not able to change or switch its storage state of the resistive storage element $40_1$.

In an access state of the memory cell $30_1$, both the first and the second switches $46_1$, $48_1$ are in their ON-states with a high conductivity. Thereby, any voltage between the second terminal $36_1$ and the first terminal $32_1$ of the memory cell $30_1$ is directly applied to the first and the second terminals $42_1$, $44_1$ of the resistive storage element $40_1$. In this access state, the storage state of the resistive storage element $40_1$ may be detected or read by measuring the resistance of the resistive storage element $40_1$. Furthermore, in the access state, the storage state of the resistive storage element $40_1$ may be changed or switched or written, as will be described in more detail for a specific embodiment of the memory cell 30 below with respect to FIGS. 5 and 6.

The first and the second switches $46_1$, $48_1$ are provided and coupled to the third terminal $38_1$ such that both switch generally synchronously. The switches $46_1$, $48_1$ are either both in their OFF-states or both in their ON-states. In the case of the FET switches displayed in FIG. 2, either both switches $46_1$, $48_1$ are nFETs or both switches $46_1$, $48_1$ are pFETs.

In one embodiment, the first and the second switches $46_1$, $48_1$ are provided in such a way that both are in their OFF-states when the third terminal $38_1$ of the memory cell $30_1$ is connected to a low potential and both are in their ON-states when the third terminal $38_1$ is connected to a high potential. In this case, the memory cell $30_1$ is in its idle state when its third terminal $38_1$ is at a low potential. When the electronic device 10 is not supplied with power and all potentials including the potentials of the first and third terminals $34_1$, $38_1$ of the memory cell $30_1$ are equal (i.e., the potential of the third terminal $38_1$ is low with respect to the potential of the first terminal $34_1$), the memory cell $30_1$ is in its idle state.

Alternatively, the first and the second switches $46_1$, $48_1$ may be provided in such a way that both are in their ON-states and the memory cell $30_1$ is in its access state when a low potential is provided to its third terminal $38_1$. When the electronic device 10 is not supplied with power, the memory cell $30_1$ is in its access state.

Whenever the memory cell $30_1$ is in its idle state, the resistive storage element $40_1$ is to a large extent protected or shielded from any electromagnetic interference. Both terminals $42_1$, $44_1$ of the resistive storage element $40_1$ are insulated since the first and the second switches $46_1$, $48_1$ are in their OFF-states. Any capacitive coupling or any other electromagnetic interference induced by the potential of any more or less adjacent other elements affects both terminals $42_1$, $44_1$ of the resistive storage element in generally the same manner. Since both terminals $42_1$, $44_1$ are insulated, the same potential is induced at both terminals $42_1$, $44_1$. Thus, no voltage or merely a very low voltage is induced across the resistive storage element $40_1$. Therefore, no programming or switching or changing of the storage state of the resistive storage element $40_1$ will occur.

In a conventional memory cell, one terminal of the resistive storage element is permanently connected to ground or any other reference potential. Any electromagnetic interference thus affects the other terminal. This results in a voltage across the resistive storage element. This voltage may be high enough to switch the storage state of the resistive storage element, thereby corrupting the information stored in the memory cell.

Figure 3:
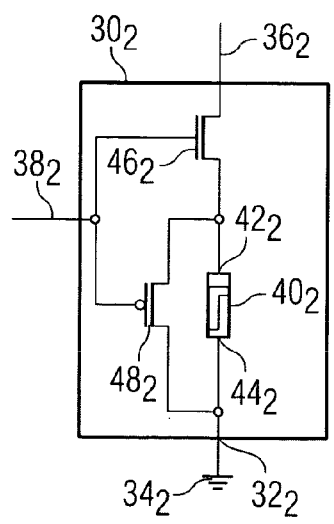
FIG. 3 is a schematic circuit diagram of a second embodiment of a memory cell of the electronic device of FIG. 1.

FIG. 3 is a schematic circuit diagram of the memory cell $30_2$ according to another embodiment of the present invention. Again, a first terminal $32_2$ of the memory cell $30_2$ is connected to ground $34_2$ or to a line providing a constant reference potential. A first switch or an access switch $46_2$ is coupled to a second terminal $36_2$ of the memory cell $30_2$ and to a first terminal $42_2$ of a resistive storage element $40_2$. A second terminal $44_2$ of the resistive storage element $40_2$ is connected to ground $34_2$ via the first terminal $32_2$ of the memory cell $30_2$. A second switch or a protective switch $48_2$ is connected to (i.e., across) the first and second terminals $42_2$, $44_2$ of the resistive storage element $40_2$. Both the access switch $46_2$ and the protective switch $48_2$ are operatively connected to the third terminal 38 of the memory cell $30_2$ such that both switches may be controlled simultaneously by potentials at the third terminal 38. The first and the second switches $46_2$, $48_2$ are provided in such a way that one of the switches $46_2$, $48_2$ is in an OFF-state and the other of the switches $46_2$, $48_2$ is in an ON-state when there is a low potential at the third terminal $38_2$ of the memory cell $30_2$ and the other way around when there is a high potential at the third terminal $38_2$.

In an idle state of the memory cell $30_2$, the access switch $46_2$ is in its OFF-state insulating the first terminal $42_2$ of the resistive storage element $40_2$ from the second terminal $36_2$ of the memory cell $30_2$. Simultaneously, the protective switch $48_2$ is in an ON-state short-circuiting or bypassing the resistive storage element $40_2$ or its terminals $42_2$, $44_2$, respectively. Due to this short circuit, no voltage across the resistive element $40_2$ can be induced by capacitive coupling or by any other electromagnetic interference. Thereby, the resistive storage element $40_2$ is efficiently protected or shielded against any unwanted change of its storage state.

In an access state of the memory cell $30_2$, the access switch $46_2$ is in its ON-state connecting the first terminal $42_2$ of the resistive storage element $40_2$ to the second terminal $36_2$ of the memory cell $30_2$. Simultaneously, the protective switch $48_2$ is in its OFF-state, thereby not connecting (or not short-circuiting) the terminals $42_2$, $44_2$ of the resistive storage element $40_2$. In this access state, the storage state of the resistive storage element $40_2$ may be detected, read, changed, switched or written via the second terminal $36_2$ of the memory cell $30_2$.

In FIG. 3, the access switch $46_2$ is a nFET, and the protective switch $48_2$ is a pFET. The gates of both are coupled to the third terminal $38_2$ of the memory cell $30_2$. When a low potential (with reference to ground $34_2$) is provided to the third terminal $38_2$ of the memory cell $30_2$, the access switch $46_2$ is in its OFF-state while the protective switch $48_2$ is in its ON-state, and the memory cell $30_2$ is in its idle state. When a high potential (with reference to ground 34) is provided to the third terminal $38_2$ of the memory cell $30_2$, the access switch $46_2$ is in its ON-state while the protective switch $48_2$ is in its OFF-state, and the memory cell $30_2$ is in its access state. Again, this means that the memory cell $30_2$ is in its idle state, and the resistive storage element $40_2$ is protected from an unwanted change of its storage state, if no power is supplied to the electronic device 10 and all potentials at the terminals $32_2$, $36_2$, $38_2$ of the memory cell $30_2$ are generally equal.

Alternatively, the access switch $46_2$ is a pFET, and the protective switch $48_2$ is a nFET. In this case, the memory cell $30_2$ is in its idle state when a high potential (with respect to ground $34_2$) is provided to the third terminal $38_2$ of the memory cell $30_2$.

Figure 4:
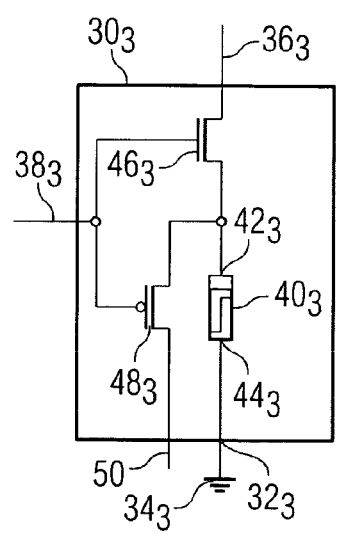
FIG. 4 is a schematic circuit diagram of a third embodiment of a memory cell of the electronic device of FIG. 1.

FIG. 4 is a schematic circuit diagram of a memory cell $30_3$ according to a third embodiment of the present invention. This embodiment differs from the embodiment described above with respect to FIG. 3 in that the protective switch $48_3$ is coupled to the first terminal $42_3$ of the resistive storage element $40_3$ and to a fourth terminal 50 of the memory cell $30_3$. In the idle state of the memory cell $30_3$, the first terminal $42_3$ of the resistive storage element $40_3$ is connected to the fourth terminal 50 of the memory cell $30_3$ instead of the second terminal $44_3$ of the resistive storage element $40_3$. A second constant reference potential may be provided to the fourth terminal 50 of the memory cell $30_3$, and the potential difference or voltage between the first and fourth terminals $32_3$, 50 of the memory cell $30_3$ is a protective voltage, as will be described in detail below with respect to FIG. 6.

Figure 5A:
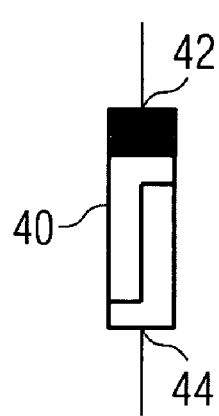
FIG. 5A displays a circuit symbol and FIG. 5B displays a schematic microscopic view of an embodiment of a resistive storage element.
Figure 5B:
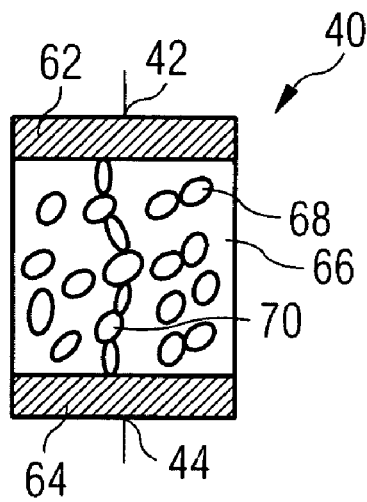

FIG. 5A displays the circuit symbol of the resistive storage element 40, and FIG. 5B is a schematic microscopic view of one embodiment of the resistive storage element 40. A first electrode 62 comprising a chemically reactive material is connected to the first terminal 42, and a second electrode 64 comprising a chemically inert material is connected to the second terminal 44 of the resistive storage element 40. An insulator 66 is provided between the first and the second electrodes 62, 64. Metal-rich clusters 68 are formed in the insulator 66. In a first state of the resistive storage element 40, most of the clusters 68 are isolated from each other in such a way that they do not form a conducting connection between the electrodes 62, 64. The insulator 66 insulates the electrodes 62, 64 from each other and the resistive storage element 40 provides a high resistance.

When a sufficiently high voltage is applied to the electrodes 62, 64, an electrochemical reaction occurs at the chemically reactive first electrode 62 and metal ions from the first electrode 62 are driven into the insulator 66. These additional ions enlarge the existing clusters 68 or form new clusters such that a conductive bridge 70 is formed by a number of clusters 68 which are in contact with each other. The conductive bridge 70 significantly reduces the resistance of the resistive storage element 40. Typically, the conductivity or the resistance, respectively, of the resistive storage element 40 differs by several orders of magnitude between the two states. An element like this is also typically called a conductive bridging junction (CBJ). A typical resistance of a CBJ is in the range of about $10^{10}\Omega$ to $10^{11}\Omega$ in the OFF-state and about $10^4\Omega$ to $10^5\Omega$ in the ON-state.

According to an example, the first or the active electrode 62 comprises or is made of silver. The second or chemically inert electrode 64 comprises or is made of tungsten. The insulator 66 comprises an insulating chalcogenide-glass (e.g., GeSe). Silver ions or other metal ions with high mobility are diffused into the insulator 66 (e.g., by photo-diffusion) and form the localized highly conductive regions or clusters 68. The first electrode 62 forms the anode and is represented by a black bar in the circuit symbol shown in FIG. 5A. The second electrode 64 is the cathode of the CBJ.

From the description of the resistive storage element 40, it is clear that the read and write circuits 20 shown in FIG. 1 need to be different from conventional sense amplifiers of DRAMs. It will become clear from the subsequently discussed schematic diagram displayed in FIG. 6 which features are advantageously comprised in each read and write circuit 20.

Figure 6:
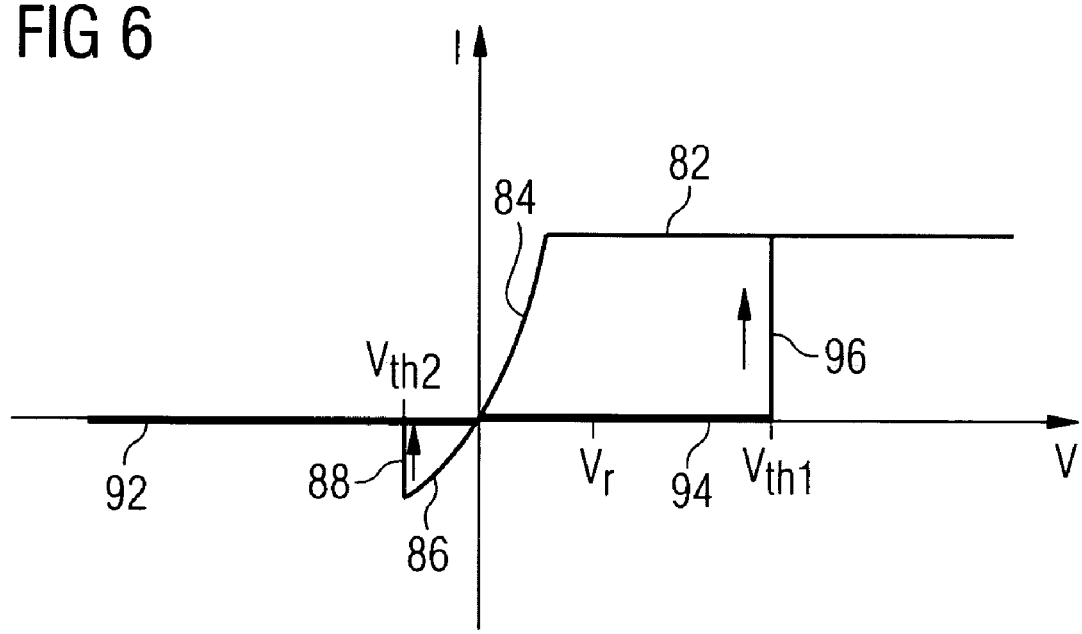
FIG. 6 is a schematic diagram of voltage and current characteristics of one embodiment of the resistive storage element.

The data schematically displayed in FIG. 6 has been acquired with a combination of a current source and a current limiter for writing, or switching the storage state of the resistive storage element 40 and with a voltage source and a current detector for detecting or reading the storage state of the resistive storage element 40. However, a simplified configuration is possible wherein the current source, the current limiter, the voltage source and the voltage detector are more or less integrated. A current-limiting facility or feature is necessary to avoid a (thermal) destruction of the resistive storage element 40 once a conductive bridge 70 is formed and the resistance of the resistive storage element 40 is low. FIG. 6 schematically displays the correlation of voltage V at and current I through a serial connection of the CBJ or the resistive storage element 40 and a current limiter.

The correlation of voltage V and current I includes a first branch 82, 84, 86 corresponding to a high conductivity of the resistive storage element 40 and a second branch 92, 94 corresponding to a low conductivity of the resistive storage element 40. The first branch 82, 84, 86 comprises a generally horizontal section 82. In this section, caused by the above-mentioned current limiter, the current I is generally constant and independent from the voltage V across the serial connection of the resistive storage element and the current limiter.

When the resistive storage element 40 is in the low conductivity state and no conductive bridge 70 exists, the current I is about zero (branches 92, 94). This low conductive state exists up to a first threshold voltage $V_{th1}$ which mainly depends on the materials and the geometrical properties of the resistive storage element 40. For the measurements presented here, the value of the first threshold voltage $V_{th1}$ is about 200 mV to 250 mV.

When the voltage V exceeds the first threshold voltage $V_{th1}$, the above-mentioned electrochemical reaction at the chemically reactive anode 62 starts and ions are driven from the anode 62 into the insulator 66. Existing clusters 68 grow and/or new clusters emerge and the conductive bridge 70 is formed. Thereby, the conductivity of the resistive storage element 40 increases quickly (first transition branch 96) and the resistive storage element 40 arrives at the high conductivity state represented by the first branch 82, 84, 86.

The high conductivity state represented by the first branch 82, 84, 86 exists for voltages above a second threshold voltage $V_{th2}$. When the voltage V falls below the second threshold voltage $V_{th2}$, the ions are driven out of the insulator 66, and the electrochemical reaction at the chemically reactive anode 62 is reversed. Thereby, clusters 68 are made smaller or even disappear. The conductive bridge 70 is degraded and disappears and the conductivity of resistive storage element 40 is reduced (second transition branch 88). The resistive storage element 40 arrives at the low conductivity state represented by the second branch 92, 94.

In one embodiment, in both the low conductivity state and the high conductivity state, a voltage sufficiently exceeding the first threshold voltage $V_{th1}$ or sufficiently below the second threshold voltage $V_{th2}$, respectively, is maintained for a predetermined period of time to arrive at a well-defined state. Each of the low conductivity and high conductivity states serves as one of a first and a second storage state representing one of a logical "0" and a logical "1".

As already mentioned above, the electrochemical reaction at the chemically reactive anode 62 starts, and ions are driven into or out of the insulator 66 as soon as the voltage V exceeds the first threshold voltage $V_{th1}$ or falls below the second threshold voltage $V_{th2}$, respectively. The size of the clusters 68, the number of conductive contacts between clusters 68, and thereby the conductivity of the conductive bridge 70 or even the number of conductive bridges roughly depend on the number of ions in the insulator 66. The number of ions in the insulator 66 depends on the total charge which flowed through the resistive storage element 40 at a voltage V exceeding the first threshold voltage $V_{th1}$ or below the second threshold voltage $V_{th2}$. Therefore, the conductivity of the resistive storage element 40 can be set or adjusted to more than two different values by controlling the current I and/or the period of time the resistive storage-element is exposed to a voltage $V>V_{th1}$ or $V<V_{th2}$. In this way, more than two different conductivity states representing an analogous number of storage states may be used, and a single memory cell may store more than only the values "0" and "1", but also the values "2", "3" etc.

For reading the conductivity state or storage state, respectively, of the resistive storage element 40, a predefined reading voltage $V_r$ between the first threshold voltage $V_{th1}$ and the second threshold voltage $V_{th2}$ is applied to the resistive storage element 40. The current flowing at this reading voltage $V_r$ is detected to detect the conductivity state and the storage state. In the binary case with two storage states, a low current means that the resistive storage element 40 is in the low conductivity state and a high current means that the resistive storage element 40 is in the high conductivity state.

The direction of the electrochemical reaction (oxidation or reduction) at the chemically reactive anode 62 and the direction of motion of the ions in the insulator 66 depend on the polarity of the voltage applied to the resistive storage element 40. Therefore, it does make a difference whether the anode or the cathode of the resistive storage element are oriented towards the second terminal 36 of the memory cell 30 and the bit line 22. However, the resistive storage element 40 may be integrated into each of the embodiments of the memory cell 30 described above with reference to FIGS. 2 to 4 in a reversed orientation as long as the read and write circuits 20 and the voltages and currents produced and detected by these are adapted correspondingly.

Resistive storage elements other than the CBJ described above with reference to FIGS. 5 and 6 may be used as well. Depending on the type of resistive storage element, it may be advantageous to apply a voltage to the fourth terminal 50 of the embodiment of the memory cell 30 described above with reference to FIG. 4 which is different from the potential of the ground 34. In particular, it may be advantageous to apply a protective voltage to the resistive storage element 40 in the idle state of the memory cell 30 which is near the middle or average of the voltages at which a change of the conductivity state is induced. In the embodiment described above, it may be particularly advantageous to apply the reading voltage $V_r$ or a voltage between 0 and the reading voltage $V_r$ to the resistive storage element 40 when the memory cell 30 is in its idle state.

As already mentioned above, the present invention can also be applied to a resistive storage element with three or more different storage states. In this case the present invention particularly protects the resistive storage element 40 in all its lowly conductive storage states in which the potential of one node is more or less floating and electromagnetic interference may induce a voltage $V>V_{th1}$ or $V<V_{th2}$.

Both switches 46, 48 of the memory cell 30 provide generally the same high resistance in their OFF-states. A switch 46, 48 in its highly resistive OFF-state is understood as not connecting. Likewise, a switch 46, 48 in its highly conductive ON-state is connecting.

The switches 46, 48 may be controlled via two different word lines. This may be particularly advantageous in the embodiments described above with reference to FIGS. 3 and 4 where both switches 46, 48 are not of the same type (nFET or pFET). One of these word lines controls the access switches 46 of the memory cells 30 and the other word line controls the protective switches 48 while one of the word lines is active and the other is inactive and vice versa.

While the foregoing is directed to embodiments of the present invention, other and further embodiments of the invention may be devised without departing from the basic scope thereof, and the scope thereof is determined by the claims that follow.

What is claimed is:

1. An electronic device, comprising:
   a memory cell and a control circuit, the memory cell comprising:
      a resistive storage element having a first terminal and a second terminal, wherein the resistive storage element is switchable between a first storage state having a first conductivity and a second storage state having a second conductivity;
      an access switch coupled to the first terminal of the resistive storage element and to a node, the access switch connecting the first terminal of the resistive storage element to the node in an access state of the memory cell and insulating the first terminal of the resistive storage element from the node in an idle state of the memory cell;
      a protecting switch connected to the resistive storage element, the protecting switch, in the idle state of the memory cell, reducing the voltage across the resistive storage element and, in the access state of the memory cell, enabling reading and writing of the storage states of the resistive storage element; and
      a read and write circuit connected to the node, allowing data to be written to and read from the node via a common bit line,
   wherein the control circuit is operatively coupled to the access switch and to the protecting switch and is configured to control the access switch and the protecting switch to switch respectively in the access state and in the idle state of the memory cell,
   wherein the protecting switch is coupled to the first terminal of the resistive storage element and a reference potential line, and
   wherein the second terminal of the resistive storage element is connected to a ground connection.

2. The electronic device of claim 1,
   wherein the bit line is connected to a sense amplifier,
   wherein the control circuit is connected to the access switch via a first word line, and
   wherein the control circuit is connected to the protecting switch via one of the first word line and a second word line.

3. The electronic device of claim 1, wherein the resistive storage element further provides a third storage state with a third conductivity.

4. An electronic device, comprising:
   a memory cell and a control circuit, the memory cell comprising:
      a resistive storage element having a first terminal and a second terminal, wherein the resistive storage element is switchable between a first storage state having a first conductivity and a second storage state having a second conductivity;
      an access switch coupled to the first terminal of the resistive storage element and to a node, the access switch connecting the first terminal of the resistives torage element to the node in an access state of the memory cell and insulating the first terminal of the resistive storage element from the node in an idle state of the memory cell; and
      a protecting switch connected to the resistive storage element, the protecting switch, in the idle state of the memory cell, reducing the voltage across the resistive storage element and, in the access state of the memory cell, enabling reading and writing of the storage states of the resistive storage element, ps wherein the control circuit is operatively coupled to the access switch and to the protecting switch and is configured to control the access switch and the protecting switch to switch respectively in the access state and in the idle state of the memory cell, wherein the resistive storage element comprises a conductive bridging junction, wherein the protecting switch is coupled to the first terminal of the resistive storage element and a reference potential, and wherein the second terminal of the resistive storage element is connected to a ground connection.

5. The electronic device of claim 4, wherein the conductive bridging junction comprises:
   a first electrode comprising a chemically reactive material; and
   a second electrode comprising a chemically inert material;
   a switching material disposed between the first and second electrodes, wherein ions from the chemically reactive material of the first electrode are drivable into the switching material by a first predetermined programming voltage applied to the first and second electrodes and wherein ions are drivable out of the switching material by a second predetermined programming voltage applied to the first and second electrodes.

6. An electronic device having a memory cell, the memory cell comprising:
   a resistive storage element having a first terminal and a second terminal, wherein the resistive storage element is switchable between a first storage state having a first conductivity and a second storage state having a second conductivity;

a first electronic switch, coupled to the first terminal of the resistive storage element and to a data line, for connecting the first terminal to the data line in an access state of the memory cell, and for insulating the first terminal from the data line in an idle state of the memory cell; and a second electronic switch, coupled to the resistive storage element, for connecting the resistive storage element in the access state, and for disconnecting the resistive storage element in the idle state, wherein the second electronic switch is coupled across the first and second terminals of the resistive storage element, wherein the second terminal of the resistive storage element is connected to a ground connection, and wherein the second electronic switch connects the first terminal to the second terminal in the idle state.

7. The electronic device of claim 6, wherein the data line is a bit line connected to a sense amplifier.

8. The electronic device of claim 6, further comprising:
a control circuit for controlling respective functions of the first and second electronic switches in the access state and in the idle state of the memory cell; and
a word line connecting the first and second electronic switches to the control circuit.

9. The electronic device of claim 6, wherein the resistive storage element further provides a third storage state with a third conductivity.

10. The electronic device of claim 6, wherein the resistive storage element comprises a conductive bridging junction.

11. The electronic device of claim 10, wherein the conductive bridging junction comprises:
a first electrode comprising a chemically reactive material;
a second electrode comprising a chemically inert material; and
a switching material between the first and second electrodes, wherein ions from the chemically reactive material of the first electrode are drivable into the switching material by a first predetermined programming voltage applied to the first and second electrodes and wherein ions are drivable out of the switching material by a second predetermined programming voltage applied to the first and second electrodes.

12. An electronic device, comprising:
a memory cell and a control circuit,
the memory cell comprising:
a resistive storage element with a first terminal and a second terminal, wherein the resistive storage element is switchable between a first storage state with a first conductivity and a second storage state with a second conductivity;
a first electronic switch coupled to the first terminal of the resistive storage element and to a data line; and
a second electronic switch coupled to the first terminal of the resistive storage element and to a reference potential line,
wherein the control circuit is operatively coupled to the first and second electronic switches and is configured to control the first and second electronic switches such that the second electronic switch connects the first terminal to the reference potential line when the first electronic switch does not connect the first terminal to the data line, and such that the second electronic switch does not connect the first terminal to the reference potential line when the first electronic switch connects the first terminal to the data line.

13. The electronic device of claim 12, wherein the second electronic switch is coupled to the first terminal of the resistive storage element and the second terminal of the resistive storage element, and wherein the reference potential line is a ground connection.

14. The electronic device of claim 12, wherein the second terminal of the resistive storage element is connected to a ground connection.

15. The electronic device of claim 12, wherein the data line is a bit line connected to a sense amplifier of the electronic device.

16. The electronic device of claim 12, wherein the control circuit is connected to the first electronic switch via a first word line and wherein the control circuit is connected to the second electronic switch via one of the first word line and a second word line.

17. The electronic device of claim 12, wherein the resistive storage element further provides a third storage state with a third conductivity.

18. The electronic device of claim 12, wherein the resistive storage element comprises a conductive bridging junction.

19. The electronic device of claim 18, wherein the conductive bridging junction comprises:
a first electrode comprising a chemically reactive material;
a second electrode comprising a chemically inert material; and
a switching material disposed between the first and second electrodes, wherein ions from the chemically reactive material of the first electrode are drivable into the switching material by a first predetermined programming voltage applied to the first and second electrodes and wherein ions are drivable out of the switching material by a second predetermined programming voltage applied to the first and second electrodes.

20. The electronic device of claim 12, wherein the first and second electronic switches are of complementary types in which, for a respective applied potential, one switch is switched ON while the other switch is switched OFF.

21. An electronic device, comprising:
a memory cell and a control circuit, the memory cell comprising:
a resistive storage element having a first terminal and a second terminal, wherein the resistive storage element is switchable between a first storage state having a first conductivity and a second storage state having a second conductivity;
an access switch coupled to the first terminal of the resistive storage element and to a node, the access switch connecting the first terminal of the resistive storage element to the node in an access state of the memory cell and insulating the first terminal of the resistive storage element from the node in an idle state of the memory cell; and
a protecting switch connected to the resistive storage element, the protecting switch, in the idle state of the memory cell, reducing the voltage across the resistive storage element and, in the access state of the memory cell,
enabling reading and writing of the storage states of the resistive storage element,
wherein the control circuit is operatively coupled to the access switch and to the protecting switch and is configured to control the access switch and the protecting switch to switch respectively in the access state and in the idle state of the memory cell, and wherein the protecting switch is coupled to the first and second terminals of the resistive storage element, and wherein the protecting switch, in the idle state, connecting the first and second terminals of the resistive storage element.

22. An electronic device, comprising:
a memory cell and a control circuit, the memory cell comprising:
  a resistive storage element having a first terminal and a second terminal, wherein the resistive storage element is switchable between a first storage state having a first conductivity and a second storage state having a second conductivity;
  an access switch coupled to the first terminal of the resistive storage element and to a node, the access switch connecting the first terminal of the resistive storage element to the node in an access state of the memory cell and insulating the first terminal of the resistive storage element from the node in an idle state of the memory cell; and
  a protecting switch connected to the resistive storage element, the protecting switch, in the idle state of the memory cell, reducing the voltage across the resistive storage element and, in the access state of the memory cell, enabling reading and writing of the storage states of the resistive storage element,
wherein the control circuit is operatively coupled to the access switch and to the protecting switch and is configured to control the access switch and the protecting switch to switch respectively in the access state and in the idle state of the memory cell; and
wherein the second electronic switch is coupled to the first terminal of the resistive storage element and a reference potential, and wherein the second terminal of the resistive storage element is connected to a ground connection.

23. An electronic device, comprising:
a memory cell and a control circuit, the memory cell comprising:
  a resistive storage element having a first terminal and a second terminal, wherein the resistive storage element is switchable between a first storage state having a first conductivity and a second storage state having a second conductivity;
  an access switch coupled to the first terminal of the resistive storage element and to a node, the access switch connecting the first terminal of the resistive storage element to the node in an access state of the memory cell and insulating the first terminal of the resistive storage element from the node in an idle state of the memory cell;
  a protecting switch connected to the resistive storage element, the protecting switch, in the idle state of the memory cell, reducing the voltage across the resistive storage element and, in the access state of the memory cell, enabling reading and writing of the storage states of the resistive storage element; and
  a read and write circuit connected to the node, allowing data to be written to and read from the node via a common bit line,
wherein the control circuit is operatively coupled to the access switch and to the protecting switch and is configured to control the access switch and the protecting switch to switch respectively in the access state and in the idle state of the memory cell,
wherein the protecting switch is coupled to the first terminal of the resistive storage element and the second terminal of the resistive storage element, and
wherein the second terminal of the resistive storage element is connected to a ground connection.

* * * * *